Figure 1:
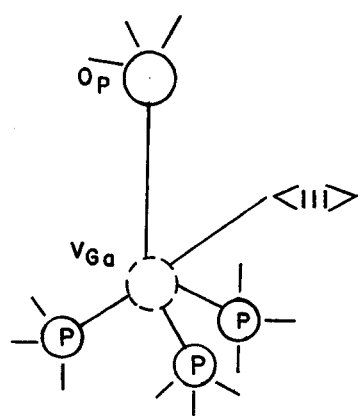

United States Patent [19]

Bhargava et al.

[11] 4,051,061

[45] Sept. 27, 1977

[54] GALLIUM PHOSPHIDE LIGHT EMITTING SEMICONDUCTIVE MATERIALS

[75] Inventors: Rameshwar Nath Bhargava, Ossining; and Gertrude F. Neumark, Hartsdale, both of N.Y.

[73] Assignee: North American Philips Corporation, New York, N.Y.

[22] Filed: Aug. 10, 1973

[21] Appl. No.: 387,519

Related U.S. Application Data

[62] Continuation of Ser. No. 165,043, July 23, 1971, abandoned.

[52] U.S. Cl. .........................252/301.4 P; 252/62.36 A
[51] Int. Cl.² ...............................................C09K 11/42
[58] Field of Search ..........................148/175, 189, 190; 252/62.3, 62.36 A, 301.4, 301.4 P

[56] References Cited

UNITED STATES PATENTS 3,669,767   6/1972   Hackett et al .................252/62.3 GA

*Primary Examiner*—Jack Cooper
*Attorney, Agent or Firm*—Frank R. Trifari, Carl P. Steinhauser

[57] ABSTRACT

Gallium phosphide luminescent semiconducting material suitable for light emitting diodes prepared by liquid phase or vapor phase epitaxy and annealing is described. By choosing appropriate deposition conditions, a high concentration of gallium vacancy—oxygen nearest neighbor complexes are created and then with acceptors filling the gallium vacanices efficient luminescent centers are produced. Using as the acceptors certain Group II-A elements produces preferred spectral outputs. In particular, yellow radiation can be obtained with the use of magnesium. A preferred method uses vapor-phase epitaxy first forming the high concentration of gallium vacancy complexes, followed by diffusion of acceptors to fill the gallium vacancies.

1 Claim, 4 Drawing Figures

GALLIUM PHOSPHIDE LIGHT EMITTING SEMICONDUCTIVE MATERIALS

This is a continuation of application Ser. No. 165,043, filed July 23, 1971, now abandoned.

This invention relates to new gallium phosphide luminescent materials and also to methods of preparing gallium phosphide luminescent materials especially suitable for light emitting diodes.

Gallium phosphide red electroluminescent diodes with external quantum efficiencies as high as 7 percent have bee reported in Applied Physics Letters, volume 15, No. 7, pages 229–231 (October 1, 1969). These materials were made by liquid phase epitaxy (LPE) producing zinc and oxygen doped P type gallium phosphide (GaP). It is suggested in this publication that the high efficiency may be due to a high concentration of Zn–O complexes which are the radiation centers for the red luminescence. Attempts by similar LPE methods to produce GaP material using other acceptors substituted for the zinc in order to produce different colored light have not been particularly successful. In particular, attempts to make such materials with magnesium substituted for the zinc have resulted in materials with no visible luminescence. It has also not been possible to reproduce the excellent results described in this article by other epitaxial methods such as vapor phase epitaxy (VPE). VPE is a much simpler process which lends itself to higher production yields than does LPE, and would be the preferred method for manufacturing such materials if comparable high efficiencies were obtainable.

VPE methods as such are known in the art. See, for example, Journal of the Electrochemical System, Volume 111, No. 2, pages 180–184 (February 1964). In the process described in this publication, single crystals of GaP were grown from the vapor phase in an open tube process in the presence of water-vapor. The manufacture of zinc and oxygen doped GaP is described. However, the resultant quantum efficiency was relatively poor compared with the LPE method previously referred to. So far as is known, no one has yet been able to satisfactorily explain why the present state of the art does not permit the use of VPE, the more desirable process for making satisfactory GaP for use in light emitting diodes.

One object of the invention is a VPE method for making efficient luminescent GaP.

Another object of the invention is a method of making improved GaP to which can subsequently be added any desired acceptor to produce efficient luminescent material having different spectral outputs characteristic of the introduced acceptor.

Still another object of the invention is efficient GaP doped with acceptors other than zinc and cadmium.

The present invention is based upon the following principles. Gallium phosphide has been found to exhibit a new luminescence which can be attributed to a gallium vacancy complexed with an oxygen donor. This luminescence at low temperatures occurs in the orange region of the spectrum. Impurities present in the material can fill the gallium vacancies forming a new complex with the oxygen donor. Certain of these complexes are highly desirable. Others are highly undesirable. The impurities which fill the gallium vacancies in an undesirable manner, which we will refer to hereinafter as contaminants, are undesirable because the resulting complex is a center for non-radiative recombination. Examples of such impurities which mainly come from Column IV of the Periodic Table are silicon and carbon. Another possible contaminant is copper. Desirable impurities to fill the gallium vacancies in the complex are the known acceptors, the most popular of which are zinc and cadmium. It is our belief as suggested in the Applied Physics Letter publication that the high efficiency exhibited by the material there described is indeed due to the high concentration of radiation centers formed by the zinc-oxygen complex. However, by substituting for the zinc in a material containing a high concentration of the Ga vacancy complexes, other acceptors, then it is possible to obtain efficient luminescent materials with different spectral outputs. In general, we prefer to use as these acceptors any of the group II-A elements of the Periodic Table, namely, beryllium, magnesium, calcium, strontium and barium. We prefer, however, magneisum, for the following reasons. The gallium vacancy is relatively small in size and is most easily filled with small atoms. Beryllium and magnesium atoms will most easily fill the gallium vacancy. However, the toxic character of beryllium makes it extremely difficult to work with, and for that reason we prefer magnesium. By producing GaP with a high concentration of magnesium-filled, gallium vacancy-oxygen donor complexes, we have been able to produce a bright yellow radiation. So far as we know, nobody before us has been able to produce yellow emitting gallium phosphide of reasonable efficiency.

Based on the above princples, we have found it possible to manufacture by VPE, GaP of high efficiency. We believe that the failure of other workers in this art has been due to the presence of the contaminant atoms previously mentioned which preferentially filled the gallium vacancies preventing their acceptance of the desired acceptor atoms. By taking appropriate steps when employing the VPE process to avoid the aforementioned contaminants, then the gallium vacancies will be filled with the desired acceptors, introduced during the epitaxial growth or subsequently. The latter is preferred because by first growing the material without the acceptors present the intermediate product can be tested to determine whether or not it exhibits the bright orange luminescence previously mentioned which we believe to be characteristic of the gallium vacancy-oxygen complexes. The material is thus so-to-speak primed and ready for the introduction of the acceptors. This can be carried out by low temperature diffusion methods. The diffusion step by itelf does not ensure that the introduced acceptor atoms will fill the gallium vacancies. The latter is accomplished by the subsequent annealing of the material, preferably in vacuum, providing sufficient mobility for the acceptor atoms to move into the gallium vacancies. we have established the foregoing by a number of experiments, some of which were as follows. first was produced the GaP material exhibiting the bright orange luminescence. The material was then annealed in an atmosphere containing carbon and silicon contaminants. In the resultant material, the orange spectrum has been quenched and the material had no appreciable luminescence. similarly, when magnesium was introduced into the material which previously exhibited the orange spectrum, then we obtained in the resultant material a yellow luminescence which we attribute to the magnesium-oxygen complex.

Figure 4:
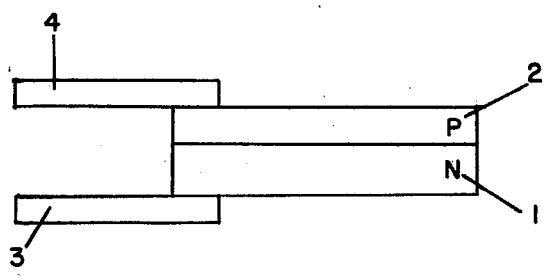
Figure 2:
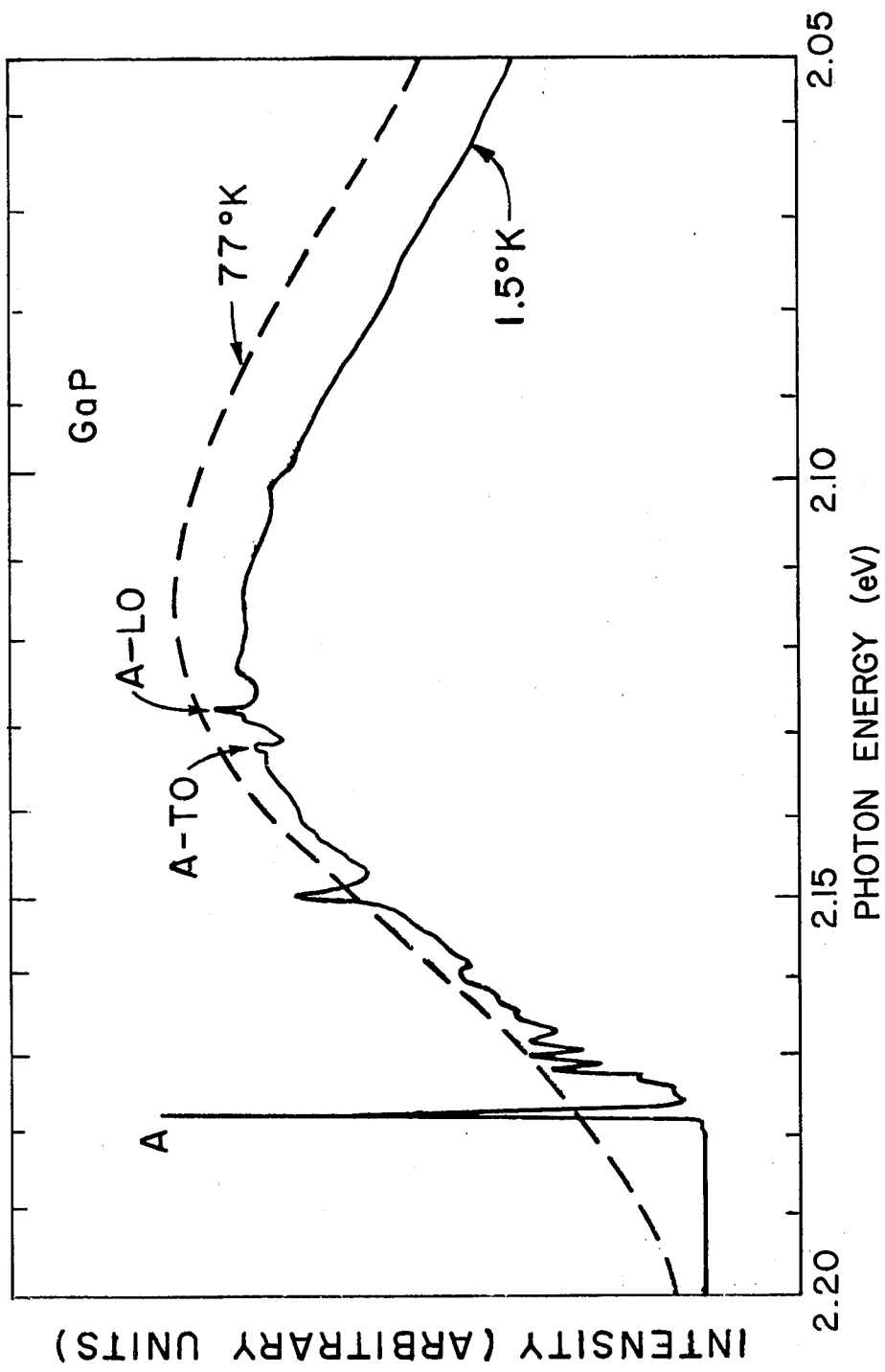
Figure 3:
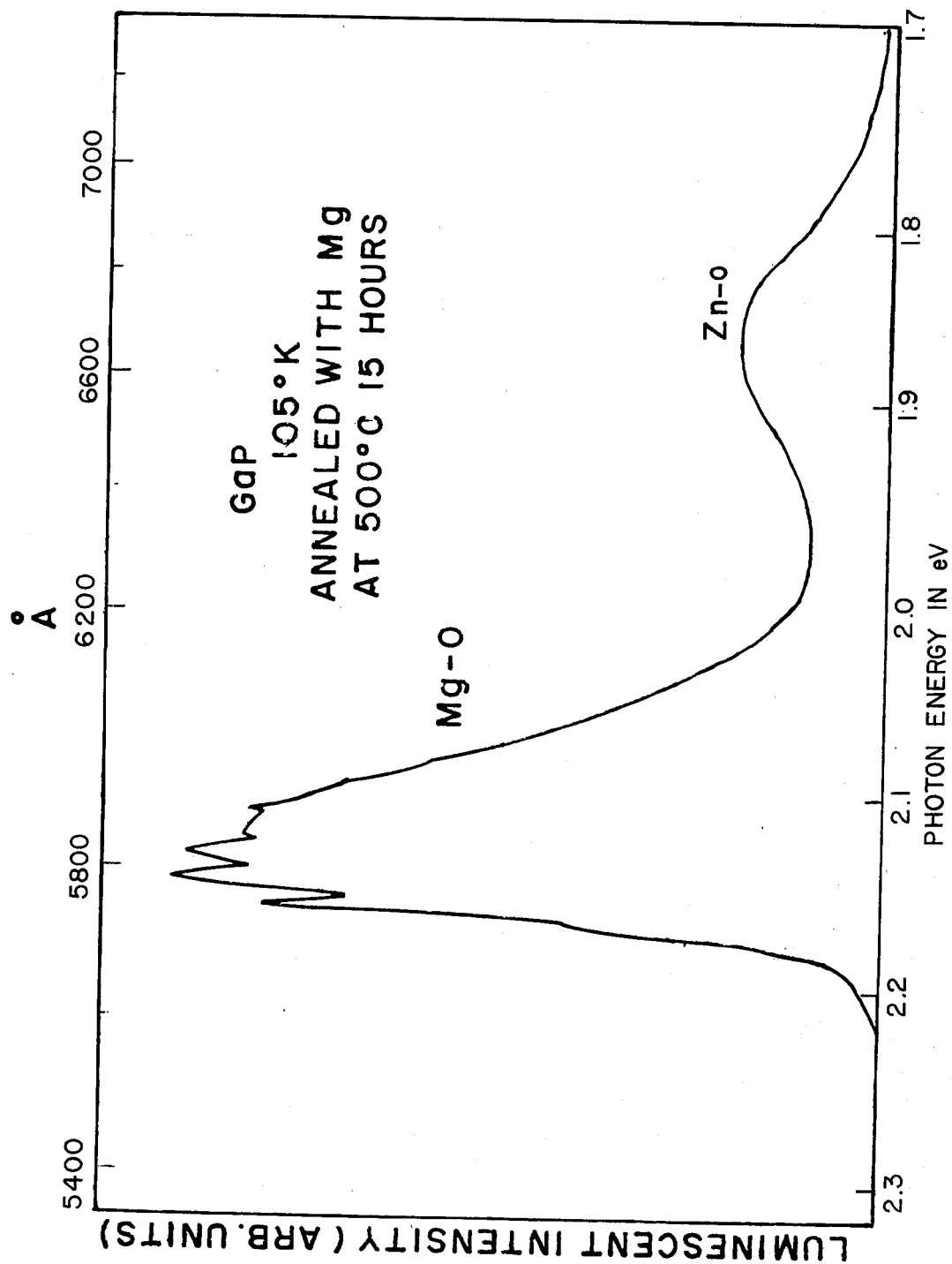

The invention will now be described with reference to the accompanying drawings where in FIG. 1 is a sketch of the gallium vacancy-oxygen complex which we believe is responsible for the new luminescence found in GaP; FIG. 2 is the orange spectra of GaP having a high concentration of the gallium vacancy-oxygen complexes illustrated in FIG. 1; FIG. 3 is the spectra of GaP with magnesium filling the gallium vacancies; FIG. 4 illustrates the construction of a typical GaP light-emitting diode.

As previously described certain gallium phosphide materials grown under very pure conditions in the presence of oxygen have been found to exhibit a new luminescence, which is illustrated in FIG. 2 of the accompanying drawing. The solid line curve is the spectra obtained with normal excitation, in this particular case with radiation from a laser at 4880 Angstrom when the sample was at a temperature of 1.5° K. The dashed line curve is the spectrum of the same sample at 77° K. Both spectrums as will be observed exhibit a broad peak in the orange region at about 2.12 eV. At room temperature one would expect a slight shift in the peak towards lower photon energy. The very sharp line indicated by the letter A is associated with a sharp zero phonon transition at 2.177 eV. Similar phonon assisted transitions involving A-Lo and A-To vibrations occur at the other locations designated in the drawing. These transitions disappear at the higher temperature. The materials with which we have carried out our experiments and which have resulted in satisfactory efficient material all exhibited the same bright orange luminescence generally of the type depicted in this FIG. 2.

We have concluded that the spectrum depicted in FIG. 2 can be attributed to a gallium vacancy complex with an oxygen donor acting as a radiation center of this material. FIG. 1 schematically illustrates such a complex in a gallium phosphide crystal. The circle with the letter P represents phosphorus atoms. The dashed line circle designated $V_{Ga}$ represent the vacancy site where the gallium atom would have been located had it been present. The line terminating in the symbol (111) designates the 111 direction. The circle designated $O_P$ represents the oxygen atom at the phosphorus site.

We regard the existence of a large concentration of such vacancy complexes as a prerequisite to the formation of a corresponding high concentration of radiation centers when the vacancies have been filled with appropriate acceptors. The method of our invention basically involves the necessary steps to establish this high concentration of vacancy complexes. This requires an epitaxial process carried out in the presence of oxygen to provide the oxygen donor, with care exercised to insure the substantial absence of those contaminant atoms which have a strong affinity for filling the gallium vacancies of such a complex.

The material that we have produced has been manufactured by equipment of the type described in an article published in Philips Research Reports, Volume 24, pages 210–230 (July 1969). In this equipment, care is taken to insure as much as possible the absence of the aforementioned contaminants which could detrimentally affect the grown material. Those skilled in the art will recognize the necessary modifications of such epitaxial growing equipment to achieve this result. Such steps as the use of inert materials such as Teflon for the apparatus joints, and the use of special greases free of the aforementioned contaminants on the joints, are well known in the art.

The preferred method to be employed is VPE in an open tube water vapor transport process. Such methods are not only described in the aforementioned Philips Research Report Publication, but also in the previously mentioned Journal of the Electrochemical Society publication except that as previously mentioned it is not believed that the equipment there employed was sufficiently free of the mentioned contaminants to provide the desired high concentration of gallium vacancy-oxygen donor complexes. The process should be carried out such that the contaminant concentration of the epitaxially grown layer is well below $10^{16}$ per cubic cm. In a typical example, using the method of the Journal of the Electrochemical System article, the temperature of the substrate was maintained at 1050° C. In general, growth temperature may range between 800° and 1200° C. The substrate in this case was N type gallium phosphide obtained from commercial suppliers with a surface polished to expose a (111) Ga face. $H_2$ containing $H_2O$ vapor was passed over a source of pure polycrystalline GaP and then caused to pass over the polished face of the substrate. The same flow rates were employed as described in the aforementioned publication and the polycrystalline source was maintained at the same temperature. The epitaxial layer that formed on the polished face was approximately 500 microns thick. To test whether or not the resultant epitaxial layer had the desired high concentration of vacancy complexes, it was excited by light having a wave-length of 4880 A. and if the characteristic orange spectrum depicted in FIG. 2 was found, then the subsequent step of introducing a suitable acceptor was carried out.

One of the features of our invention is that acceptors can be incorporated after epitaxial growth by a relatively simple low temperature diffusion process. In one example, zinc as the acceptor was vacuum deposited on the surface of the epitaxial layer while the latter was maintained at 800° C. for a period of 3 hours. In general the zinc diffusion can be obtained between 400–950° C. for periods ranging from about 1–6 hours. While in principle it is also possible to incorporate the acceptors at the same time that the epitaxial layer is growing by providing as is well known an acceptor source upstream of the substrate, we prefer to incorporate the acceptors subsequently. Following the introduction of the zinc, the resultant material is annealed in vacuum in order to enable the zinc atoms to move into and fill the available gallium vacancies. Annealing may take place at relatively low temperature of between 400–600° C. for a period of about 2–20 hours. In a particular example, the annealing temperature was 500° and time was 15 hours. The resultant material made in the manner above described upon excitation by the aforementioned ultraviolet radiation showed a high efficient output of red light.

As previously mentioned, one of the features of our invention is the ability to substitute other acceptors for the zinc and to obtain different spectral outputs. Group II-A elements are preferred, and of the latter, magnesium is preferred. As an example thereof, the epitaxial material as described above but prior to the zinc incorporation, was placed in a tightly closed graphite crucible containing a small piece of Mg, which crucible was then placed in a quartz ampoule which was evacuated and then sealed. The assembly was then heated first at 800° C. for three hours for incorporating magnesium into the epitaxial layer, and then subsequently heated at 500° C. for 15 hours to anneal same in order to allow the magnesium atoms to fill the gallium vacancies. The resultant material when excited by light of the same wave-length produced emission in the yellow region peaking at 5800 Angstrom at a temperature of 105° K. This spectrum is illustrated in FIG 3. The small peak on the right has been attributed to the presence of a small amount of zinc in the original material as a contaminant. So far as we know, nobody before us has made gallium phosphide material emitting yellow radiation. By substituting beryllium for the magnesium in the last mentioned example, one obtains greenish-yellow radiation peaking at about 5700° A. under ultraviolet irradiation at low temperatures, for example 10° K.

In above mentioned examples, P type GaP is produced by incorporation of acceptors on a substrate of N type gallium phosphide. In this case, it is merely necessary in order to form a well-known light emitting diode to make connections by known techniques to the N type substrate and the P type layer, and upon application of a suitable low voltage will cause generation of radiative recombination when minority carriers are injected into the P side in the forward biased condition. such a structure is schematically illustrated in FIG. 4 where the substrate is designated 1, the P epitaxial layer 2, and the ohmic contacts 3 and 4 respectively.

It is not essential that the substrate be of gallium phosphide. It can be of any material having a crystal structure on which epitaxial gallium phosphide can be grown. For example, it can be of a III-V compound such as gallium arsenide or of mixed crystals of gallium arsenide and gallium phospide, or it can be of silicon. The nature of the substrate is not too important as the major luminescence derives from the P type gallium phosphide.

It is believed that the optimuim material will have a concentration of g allium vacancies or complexes in the range of $10^{16}$-$10^{18}$ per cubic cm., and when the acceptors are introduced to fill the gallium vacancies, they would be present in about the same concentration of $10^{16}$-$10^{18}$. It is of course possible to introduce more than one of the Group II-A element into the gallium phosphide, which would result in a shifting of the color of the light output. It is also possible to introduce into the material whose vacancies are partially or completely filled with Group II-A elements a small concentration of zinc or cadmium atoms. In the case where the zinc atoms fill remaining gallium vacancies, the spectrum of FIG. 3 would result with the color of the output light depending on the relative proportion of the two acceptors. When the substrate is of gallium phosphide, it is preferred to polish the substrate to expose a (111) gallium face to receive the epitaxial growth, which it is believed assists, as a result of the stacking of the atoms, in the establishment of the desired high concentration of gallium vacancies.

As will be clear from the foregoing, the vapor transport process described in the Philips Research Report Article also may be employed in the VPE method of the invention. As previously mentioned such a VPE process is simpler than the LPE process and lends itself far better to mass production of GaP crystals. It is, however, possible with the teachings of our invention also to use the LPE process for the manufacture of gallium phosphide material containing a Group II-A element as the active acceptor. As previously explained, when attempts were made with the known LPE process to incorporate magnesium, for example, it proved unsuccesssful because it is believed that magnesium formed with the oxygen present a MgO precipitate which does not establish the desired MgO radiation complexes in the grown material. In accordance with a feature of this invention, we first grow GaP by an LPE process of the type known in the art, examples of which will be found in the aforementioned Applied Physics Letter Article, but without the Group II-A elements present, and under conditions as previously described which would prevent undesired contaminant atoms from filling the gallium vacancies formed. After the desired GaP material with the high concentration of gallium vacancy complexes has been produced, then as a subsequent second step a Group II-A element such as magnesium may be incorporated by diffusion into the material, and annealed as previsouly described to cause the magnesium atoms to fill the gallium vacancies. By this method it is also possible to produce materials which can be used to make efficient yellow diodes. The advantage of this, in addition to providing a different color than the normal red and green obtained with these or similar materials, is that the eye exhibits very high sensitivity to this yellow radiation, and a yellow diode of even low quantum efficiency would be the equivalent in brightness to an incandescent lamp because of the high eye sensitivity.

As an example of the above, oxygen doped high resistivity GaP was epitaxially grown on N-type GaP (Te was the donor in a concentration of about $1 \times 10^{18}$) by the LPE method described in the Applied Physics Letters article. Afterwards, Mg was incorporated in the same manner as previously described (heated in presence of Mg at 800° C. for 3 hours), followed by annealing at 500° C. for 15 hours. The resultant product exhibited the yellow spectrum depicted in FIG. 3.

As will be concluded from the foregoing description, our technique involves purposely introducing into the GaP crystal growth a large amount of native defects, namely $V_{Ga}$-$O_P$ complexes, and filling those vacancies with suitable acceptors creating a high number of efficient P radiative centers. This offers the important advantages of allowing the use of VPE in place of the more difficult LPE, and low temperature diffusion of the acceptors, greatly simplifying the fabrication of efficient light-emitting material.

What is claimed is:

1. Yellow luminescing single crystals of gallium phosphide containing magnesium filled Ga vacancy-$O_p$ nearest-neighbor complexes in a concentration producing under excitation with light having a wave-length of 4880 A. a spectral output at 105° K. which peaks at about 5800 A., said magnesium being present in a concentration of about $10^{16}$-$10^{18}$ per cubic centimeter, and $O_p$ symbolizes an oxygen atom at a phosphorus site in the crystal.

* * * * *